United States Patent
Takahashi

(10) Patent No.: US 7,518,471 B2
(45) Date of Patent: Apr. 14, 2009

(54) SURFACE ACOUSTIC WAVE FILTER UTILIZING A FLOATING ELECTRODE

(75) Inventor: Naoki Takahashi, Kawaguchi (JP)

(73) Assignee: Epson Toyocom Corporation, Kawasaki (JP)

( * ) Notice: Subject to any disclaimer, the term of this patent is extended or adjusted under 35 U.S.C. 154(b) by 306 days.

(21) Appl. No.: 11/398,661

(22) Filed: Apr. 6, 2006

(65) Prior Publication Data

US 2006/0226933 A1    Oct. 12, 2006

(30) Foreign Application Priority Data

Apr. 8, 2005    (JP) .............................. 2005-111784

(51) Int. Cl.
*H03H 9/64*    (2006.01)
*H03H 9/145*    (2006.01)

(52) U.S. Cl. ................... 333/195; 333/196; 310/313 C; 310/313 D

(58) Field of Classification Search ................. 333/196; 310/313 C
See application file for complete search history.

(56) References Cited

U.S. PATENT DOCUMENTS

| | | | | |
|---|---|---|---|---|
| 5,485,052 A | * | 1/1996 | Seki et al. ............... | 310/313 B |
| 5,874,868 A | * | 2/1999 | Shimoe ....................... | 333/193 |
| 5,986,524 A | * | 11/1999 | Shimoe ....................... | 333/195 |
| 6,051,908 A | * | 4/2000 | Garber et al. ............ | 310/313 B |
| 6,353,372 B1 | * | 3/2002 | Baier et al. ................. | 333/195 |
| 6,667,673 B1 | * | 12/2003 | Strauss ....................... | 333/195 |
| 2004/0212455 A1 | * | 10/2004 | Takagi et al. ................ | 333/135 |

FOREIGN PATENT DOCUMENTS

| | | | |
|---|---|---|---|
| JP | A 4-40705 | | 2/1992 |
| JP | 04-081012 | * | 3/1992 |
| JP | 4-138710 | * | 5/1992 |
| JP | A 7-74588 | | 3/1995 |
| JP | 10-135780 | * | 5/1998 |
| JP | B2 2817380 | | 8/1998 |
| JP | B2 2888493 | | 2/1999 |
| JP | A 2002-353777 | | 12/2002 |
| JP | 2003-347895 | * | 12/2003 |

* cited by examiner

*Primary Examiner*—Barbara Summons
(74) *Attorney, Agent, or Firm*—Oliff & Berridge, PLC

(57) ABSTRACT

A surface acoustic wave filter (cascaded dual mode SAW filter) includes three IDT electrodes disposed adjacent to each other along the propagation direction of a surface wave on a piezoelectric substrate and two primary-tertiary longitudinally-coupled dual mode SAW filters cascaded and constructed by arranging grating reflectors on both sides of three IDT electrodes. At least a pair of electrode fingers are thinned out from the IDT electrodes disposed outside, and floating electrodes are then disposed.

2 Claims, 8 Drawing Sheets

Imp. Zi = 50  Zo = 50  Ohm    Freq. = 1525.420 - 1625.420 MHz

Imp. Zi = 50  Zo = 50 Ohm    Freq. = 1525.420 - 1625.420 MHz

SURFACE ACOUSTIC WAVE FILTER UTILIZING A FLOATING ELECTRODE

BACKGROUND

1. Technical Field

The present invention relates to a surface acoustic wave filter, and in particular, to a narrow-band surface acoustic wave filter which is reduced in size.

2. Related Art

In recent years, a surface acoustic wave filter (SAW filter) has been widely used in telecommunications field. In other words, because of its excellent features such as high performance, small size, mass production, and the like, the SAW filter is frequently used in a mobile phone or the like. FIG. 9 is a plan view illustrating a construction of a cascaded dual mode SAW filter which is constructed by cascading two primary-tertiary longitudinally-coupled dual mode SAW filters (hereinafter, referred to as the dual mode SAW filter). The cascaded dual mode SAW filter is used in an RF filter of a mobile phone or the like. On the main surface of a piezoelectric substrate 31, IDT electrodes 32, 33, and 34 are disposed adjacent to each other along the propagation direction of a surface wave. On both sides of the IDT electrodes 32, 33, and 34, grating reflectors 35a and 35b (hereinafter, referred to as a reflector) are arranged, thereby forming a first dual mode SAW filter F1. In this case, the IDT electrodes 32, 33, and 34 are respectively formed with a pair of comb-shaped electrodes each having a plurality of electrode fingers which are fitted into each other.

On the same piezoelectric substrate 31, a second dual mode SAW filter F2 composed of IDT electrodes 32', 33', and 34' and reflectors 35'a and 35'b is formed in the same way as the first dual mode SAW filter F1. The first and second dual mode SAW filter F1 and F2 are cascaded, thereby constructing a cascaded dual mode SAW filter.

FIG. 10 illustrates filter characteristics obtained by simulation using the electrode pattern of the cascaded dual mode SAW filter shown in FIG. 9 in order to design an RF filter (in which the center frequency is 1.57542 MHz, the bandwidth is ±1 MHz, and the terminal impedance is 50 Ω) for a GPS which has recently been used in an in-vehicle telephone or the mobile phone, with the piezoelectric substrate set to a 38.7° Y—XLiTaO$_3$ substrate, the center frequency set to 1.5 GHz, 14.5 pairs of IDT electrodes 33 and 33', 9.5 pairs of respective IDT electrodes 32, 34, 32', and 34', the intersection width set to 35λ (λ is a wavelength of the surface wave), each number of reflectors 35a, 35b, 35'a, and 35'b set to 100, and the electrode film thickness set to 7.7%λ. Within the passband, a large ripple appears since a broad-band electrode pattern is used.

A technique for improving the ripple within the passband has been disclosed in JP-A-4-40705 and JP-A-7-74588. That is, as shown in FIG. 11, IDT electrodes 42, 43, and 44 are disposed adjacent to each other along the propagation direction of a surface wave on the main surface of a piezoelectric substrate 41. Further, on both sides of the IDT electrodes 42, 43, and 44, reflectors 45a and 45b are arranged, thereby forming a first dual mode SAW filter F1. On the same piezoelectric substrate 41, a second dual mode SAW filter F2 including IDT electrodes 42', 43', and 44' and reflectors 45'a and 45'b is formed in the same way as the first dual mode SAW filter F1. The first and second dual mode SAW filters F1 and F2 are cascaded. Further, between the first and second dual mode SAW filters F1 and F2, capacity electrodes 46a and 46b are disposed to be orthogonal to the propagation direction of a surface wave. Lead electrodes extending from one side of each of the comb-shaped electrodes of the capacity electrodes 46a and 46b are respectively connected to lead electrodes which cascade the filters F1 and F2. The other sides of the comb-shaped electrodes are respectively grounded, thereby constructing a narrow-band cascaded dual mode SAW filter. With the capacity electrodes 46a and 46b functioning as capacity elements, the ripple within the band disappears.

FIG. 12 shows filter characteristics obtained by simulation in a state where the constants of the dual mode SAW filter are set to be the same as those shown in FIG. 10 and the capacitance values which are formed by the capacity electrodes 46a and 46b are commonly set to 0.64 pF. As a result, a ripple does not exist within the passband, and the passband becomes flat.

JP-A-2002-353777 has disclosed a filter in which at least a pair of electrode fingers are thinned out from a center IDT electrode of a primary-tertiary longitudinally-coupled dual mode SAW filter and short-circuit-type floating electrodes are then disposed and a filter in which grating reflectors are disposed after thinning out such that the impedance of the filter can be matched with desired impedance by thinning out the electrode fingers.

In the narrow-band cascaded dual mode SAW filter according to the related art as shown in FIG. 11, however, the capacity electrodes for forming capacity elements should be provided between two of the dual mode SAW filters F1 and F2. Therefore, there is a problem that the cascaded dual mode SAW filter is enlarged as much as the space of where the capacity electrodes are provided.

SUMMARY

An advantage of some aspects of the invention is that it provides a surface acoustic filter in which electrode fingers included in IDT electrodes are suitably thinned out, and floating electrodes or electrode fingers connected to a comb-shaped electrode which is topologically reversed are then disposed, thereby constructing the IDT electrodes. Therefore, a capacity ratio of a SAW resonator which is formed by the IDT electrodes becomes larger than that of the construction according to the related art. In other words, the capacity ratio can be deteriorated. Accordingly, when a narrow-band cascaded dual mode SAW filter is constructed, capacity elements do not need to be inserted between stages, and the filter can be reduced in size.

According to an aspect of the invention, there is provided a surface acoustic wave filter (cascaded dual mode SAW filter) including three IDT electrodes disposed adjacent to each other along the propagation direction of a surface wave on a piezoelectric substrate and two primary-tertiary longitudinally-coupled dual mode SAW filters cascaded and constructed by arranging grating reflectors on both sides of three IDT electrodes. At least a pair of electrode fingers are thinned out from the IDT electrodes disposed outside, and floating electrodes are then disposed.

It is preferable that two floating electrodes be disposed so as to be substituted for the pair of thinned-out electrode fingers, and be short-circuited with respect to each other.

According to another aspect of the invention, there is provided a surface acoustic wave filter (cascaded dual mode SAW filter) including three IDT electrodes disposed adjacent to each other along the propagation direction of a surface wave on a piezoelectric substrate and two primary-tertiary longitudinally-coupled dual mode SAW filters cascaded and constructed by arranging grating reflectors on both sides of three IDT electrodes. At least one electrode finger is thinned out from the IDT electrodes disposed outside, and electrode fingers connected to the comb-shaped electrode which is topologically reversed are then disposed.

According to a still further aspect of the invention, a surface acoustic wave filter (cascaded dual mode SAW filter) including three IDT electrodes disposed adjacent to each other along the propagation direction of a surface wave on a piezoelectric substrate; and two primary-tertiary longitudinally-coupled dual mode SAW filters cascaded and constructed by arranging grating reflectors on both sides of three IDT electrodes. At least two electrode fingers are thinned out from the IDT electrodes disposed outside, and electrode fingers connected to the comb-shaped electrode which is topologically reversed are then disposed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
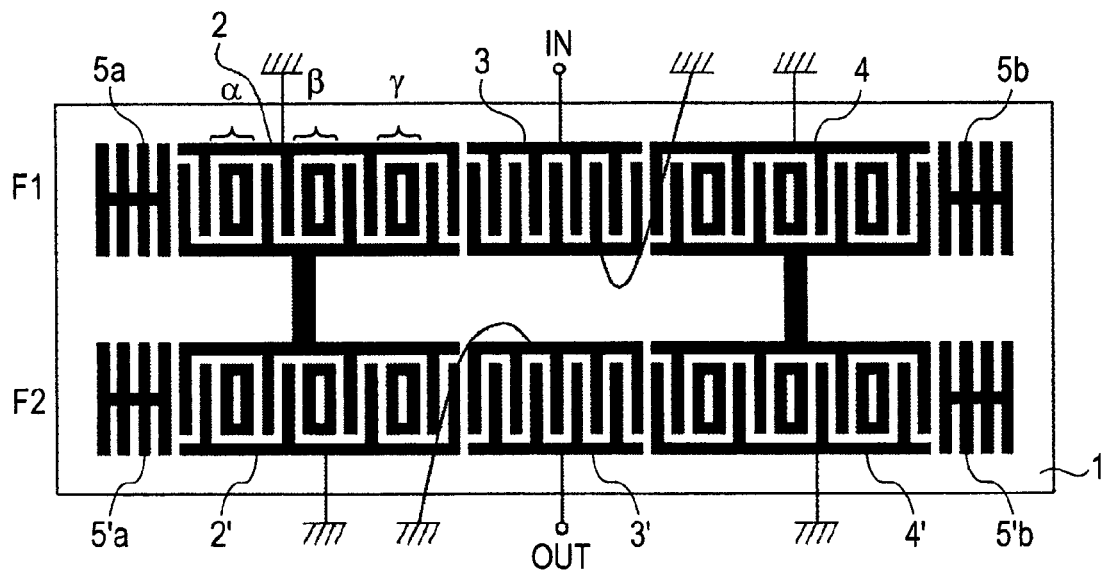
FIG. 1 is a schematic plan view illustrating the construction of a first embodiment according to the invention.

FIG. 1 is a plan view illustrating a cascaded dual mode SAW filter according to an embodiment of the invention. On the main surface of a piezoelectric substrate 1, IDT electrodes 2, 3, and 4 are disposed to be adjacent to each other along the propagation direction of a surface wave. On both sides of the IDT electrodes 2, 3, and 4, reflectors 5a and 5b are arranged, thereby forming a first dual mode SAW filter F1. Further, on the same piezoelectric substrate 1, a second dual mode SAW filter F2 including IDT electrodes 2', 3', and 4' and reflectors 5'a and 5'b is formed in the same way as the first dual mode SAW filter F1. Then, the first and second dual mode SAW filters F1 and F2 are cascaded to construct the cascaded dual mode SAW filter.

The feature of the invention is shown in the construction of the IDT electrodes 2, 3, and 4 (2', 3', and 4'). Like a typical IDT electrode, the IDT electrode 3 (3') is formed of a pair of comb-shaped electrodes each having a plurality of electrode fingers which are fitted into each other. In other words, the electrode fingers alternately connected to the plus comb-shaped electrode and the minus comb-shaped electrode. In the IDT electrodes 2 and 4 (2' and 4'), at least a pair of electrode fingers are thinned out from a pair of comb-shaped electrodes each having a plurality of electrode fingers which are fitted into each other, and short-circuited floating electrodes are then disposed so as to construct the IDT electrodes 2 and 4 (2' and 4'). Referring to the IDT electrode 2 of the embodiment shown in FIG. 1, three pairs of electrode fingers α, β, and γ are thinned out, and three short-circuit-type floating electrodes are then disposed so as to be substituted for the thinned-out electrode fingers. The IDT electrodes 4, 2', and 4' are constructed in the same way as the IDT electrode 2.

Figure 2:
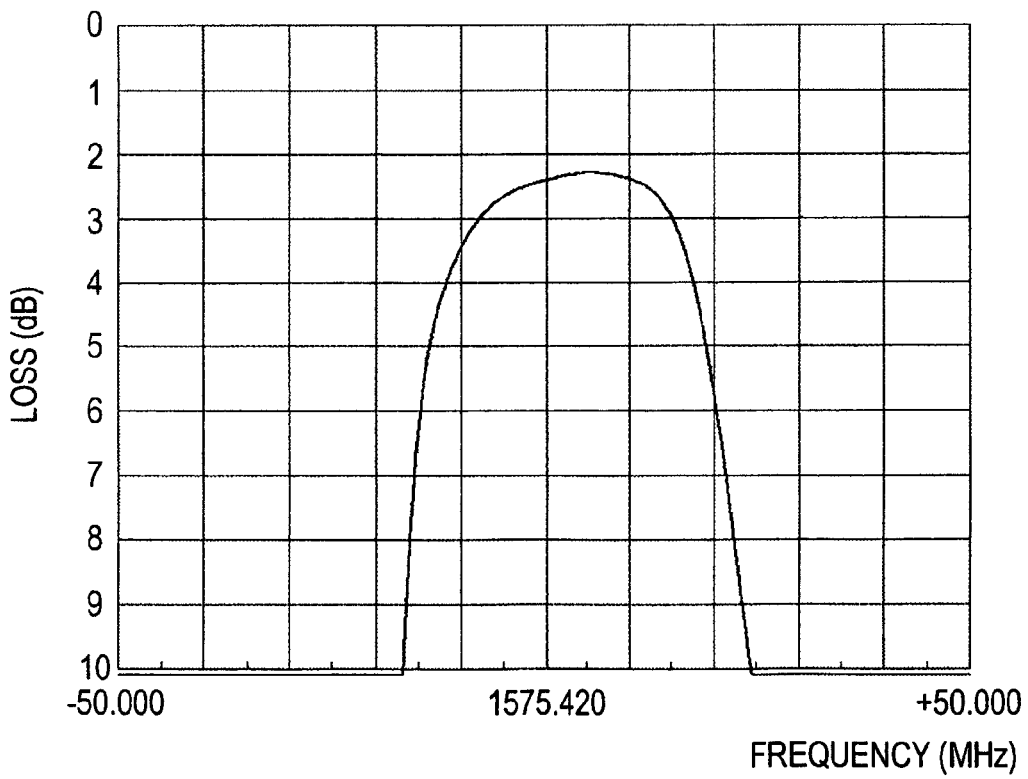
FIG. 2 shows passband characteristics obtained by simulation based on FIG. 1.
Figure 12:
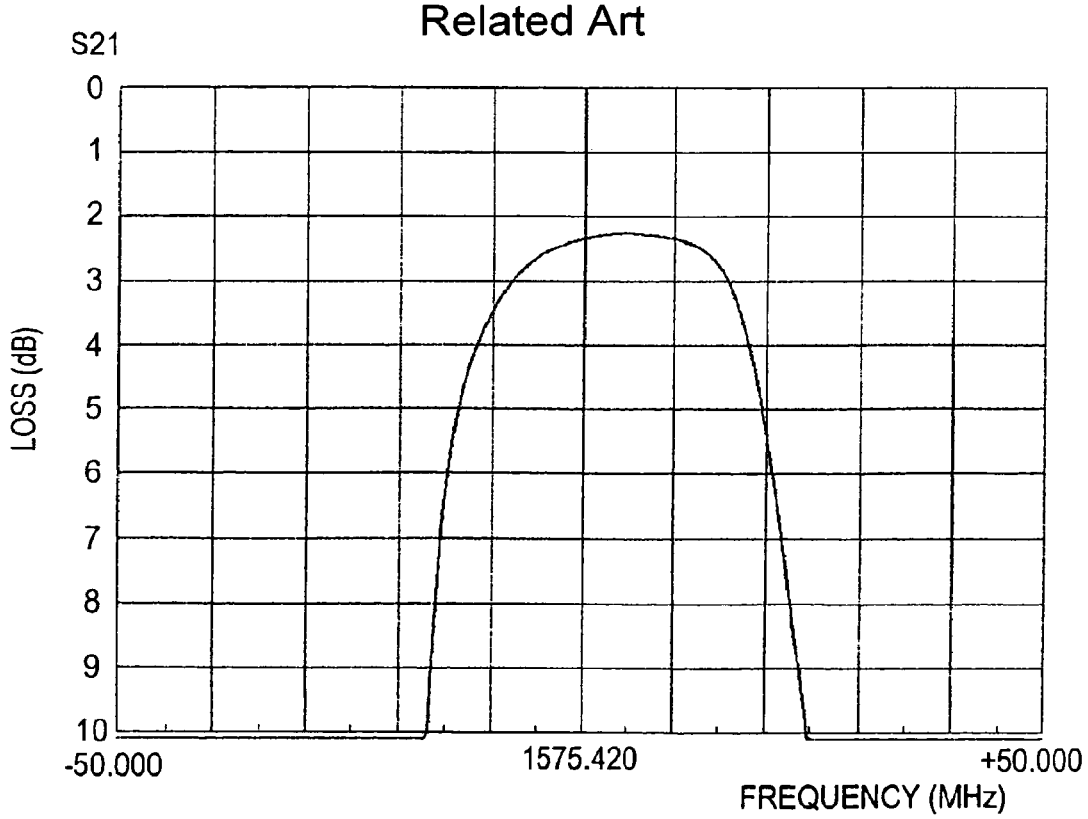
FIG. 12 shows passband characteristics obtained by simulation based on FIG. 11.

FIG. 2 shows filter characteristics obtained by simulation using the electrode pattern shown in FIG. 1, with the piezoelectric substrate set to a 38.7° Y—XLiTaO$_3$ substrate, the center frequency set to 1.5 GHz, 14.5 pairs of respective IDT electrodes 3 and 3', 9.5 pairs of IDT electrodes 2, 4, 2', and 4' (which are set before thinning out and in which three electrodes are thinned out to dispose three short-circuit-type floating electrodes), the intersection width set to 35λ (λ is a wavelength), each number of reflectors 5a, 5b, 5'a, and 5'b set to 100, and the electrode film thickness set to 7.7%λ. As shown in FIG. 2, the flatness and insertion loss within the passband are comparable to those of FIG. 12.

Figure 3:
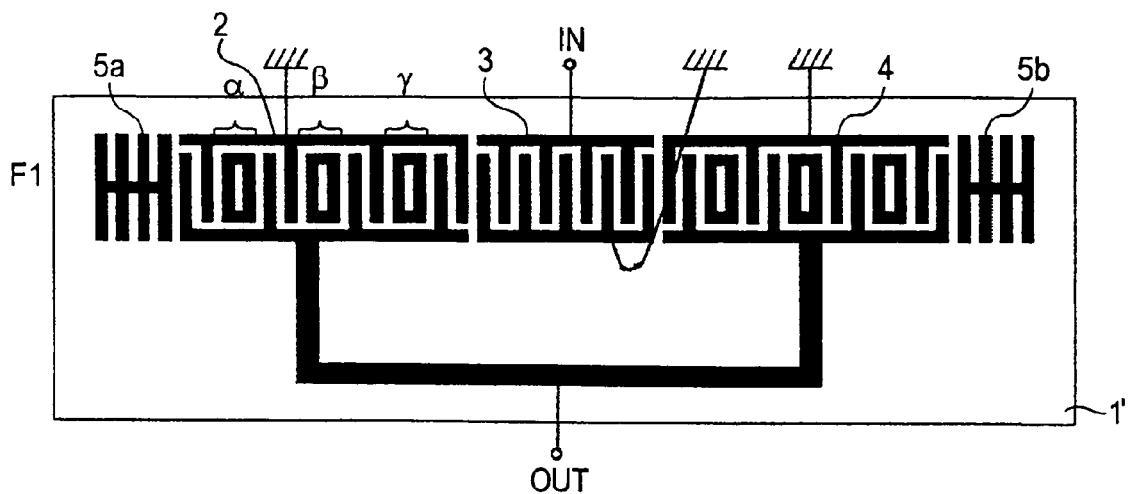
FIG. 3 is a plan view illustrating the construction of a first dual mode SAW filter F1 of FIG. 1.
Figure 4:
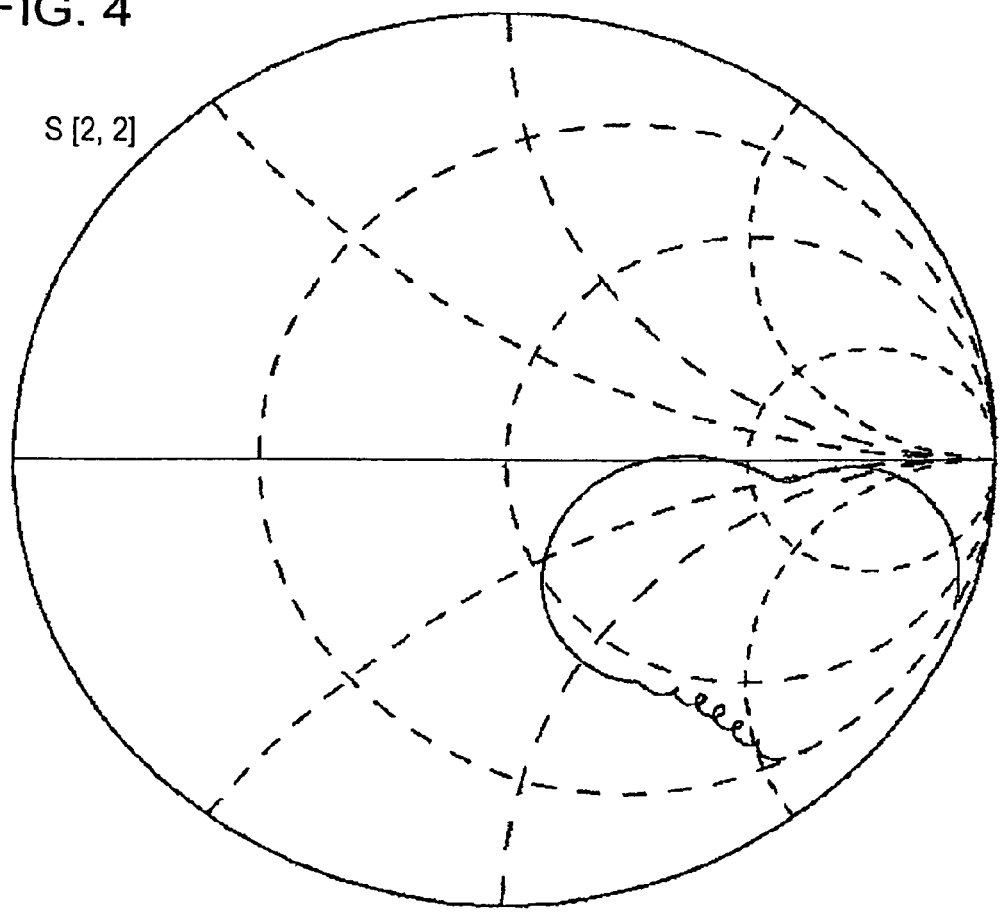
FIG. 4 is a circle diagram showing impedance characteristic of the dual mode SAW filter of FIG. 3.
Figure 11:
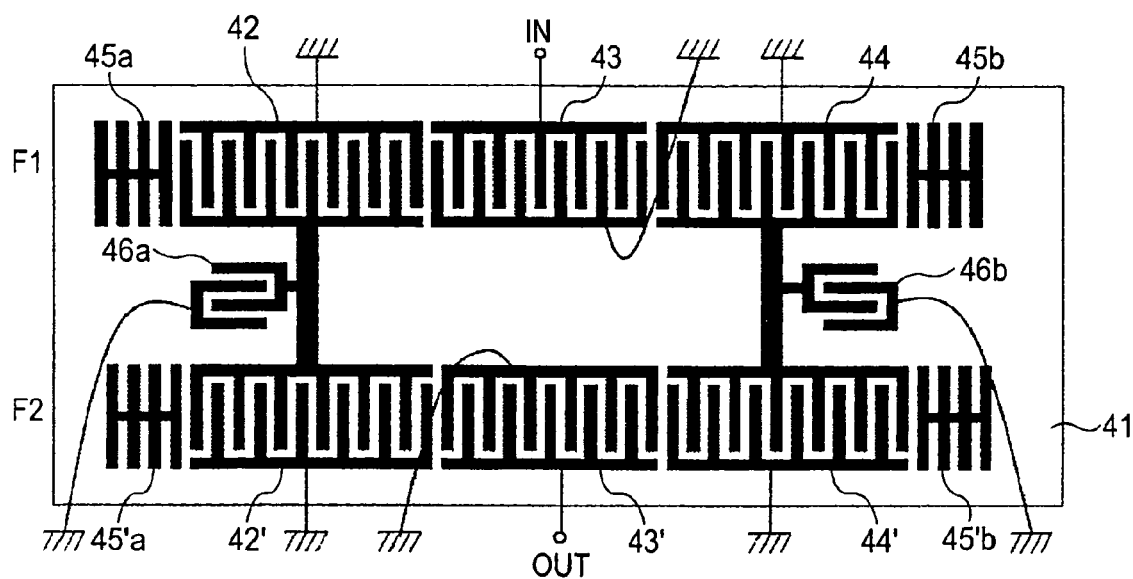
FIG. 11 is a plan view illustrating the construction of a narrow-band cascaded dual mode SAW filter.

The reason why the passband becomes flat without the capacity electrodes 46a and 46b functioning as capacity elements, which are included in the narrow-band cascaded dual mode SAW filter shown in FIG. 11, is examined. FIG. 3 illustrates a filter which is constructed by taking out only the dual mode SAW filter F1 from the cascaded dual mode SAW filter shown in FIG. 1. FIG. 4 is a circle diagram (smith chart) which is obtained by simulating the impedance characteristic of the dual mode SAW filter of FIG. 3. Within the passband of the filter, the impedance changes in the vicinity of the real axis, if the frequency is changed. On the contrary, the impedance changes at the position separated from the real axis, outside the band.

Figure 9:
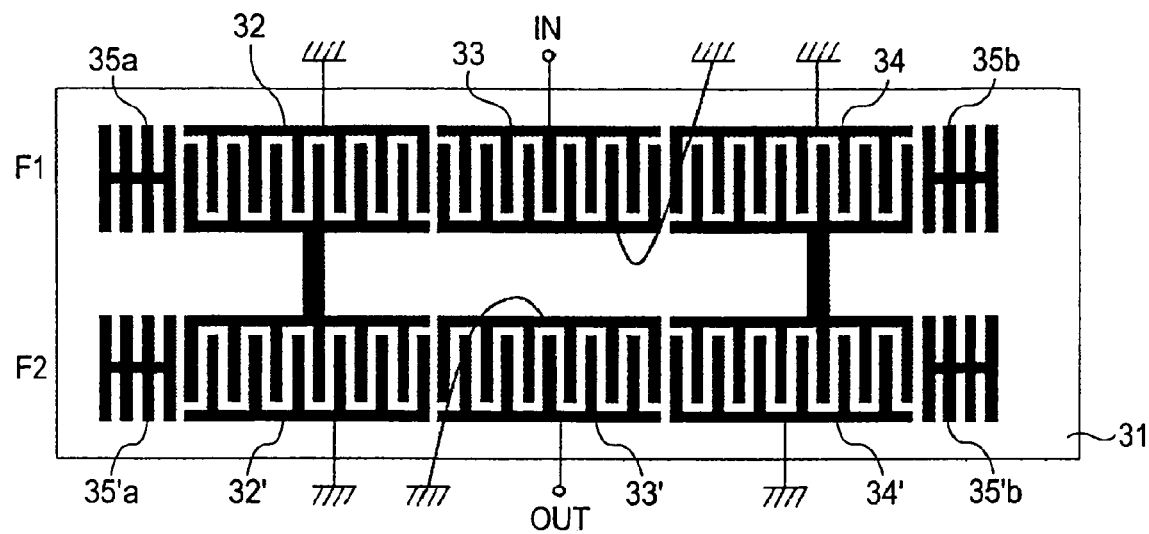
FIG. 9 is a plan view illustrating the construction of a broad-band cascaded dual mode SAW filter.
Figure 10:
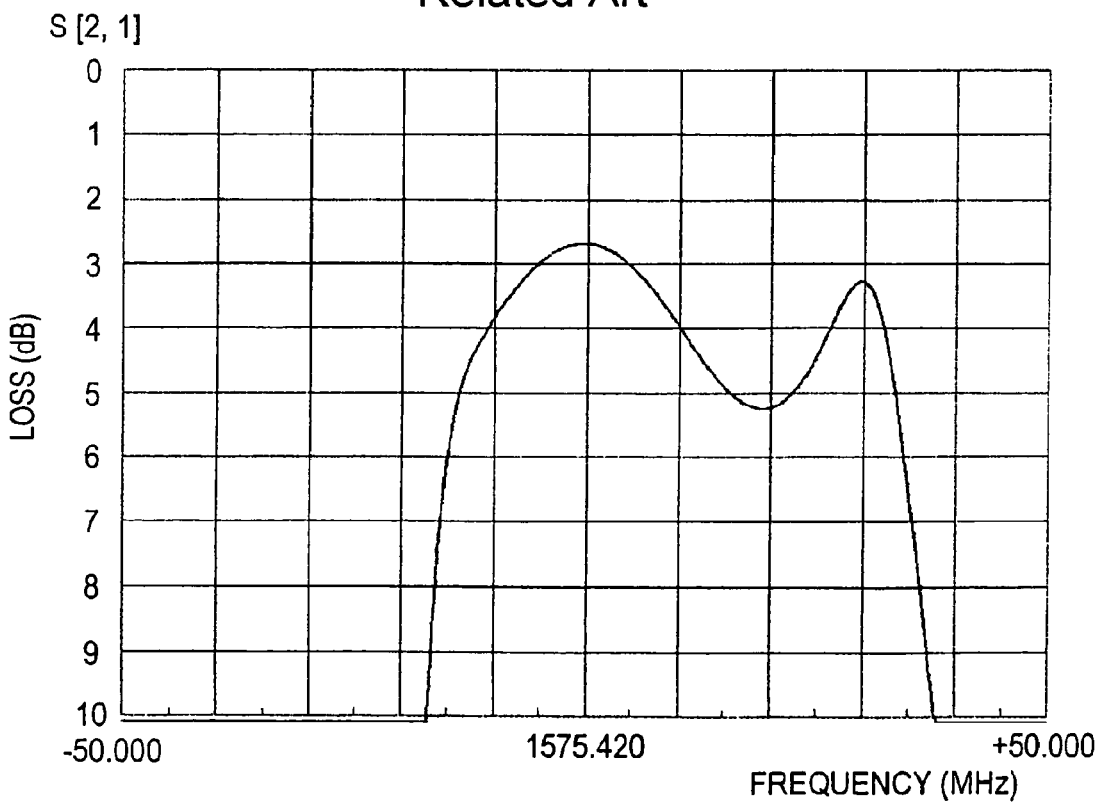
FIG. 10 shows passband characteristics obtained by simulation based on FIG. 9.
Figure 13:
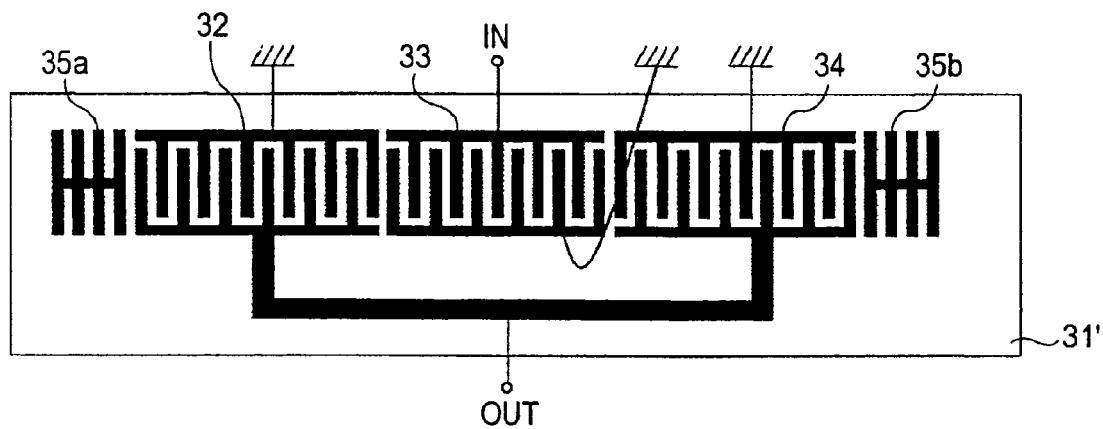
FIG. 13 is a plan view illustrating the construction of the first dual mode SAW filter F1 of FIG. 9.
Figure 14:
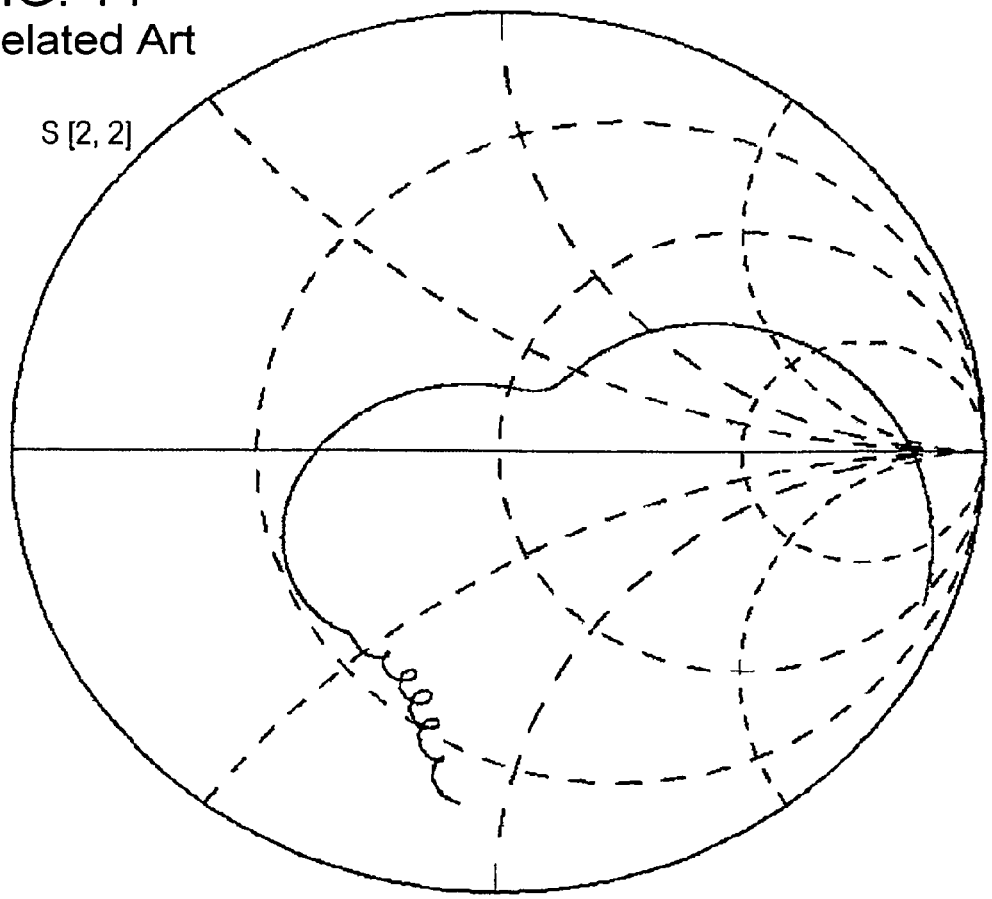
FIG. 14 is a circle diagram showing impedance characteristic of the dual mode SAW filter of FIG. 13.

Only the dual mode SAW filter F1 is taken out from the broad-band cascaded dual mode SAW filter shown in FIG. 9, and is constructed as shown in FIG. 13. FIG. 14 is a circle diagram obtained by simulating the impedance characteristic of the filter shown in FIG. 13. If the frequency is changed within the passband of the filter, the impedance changes at the position separated from the real axis. Even at the frequency outside the band, the impedance changes at the position separated from the real axis.

Figure 15:
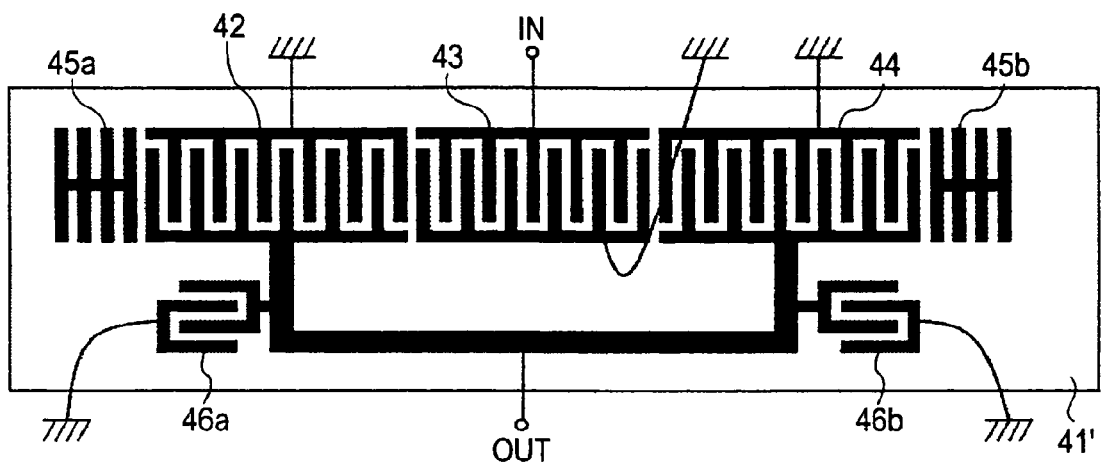
FIG. 15 is a plan view illustrating the construction of the first dual mode SAW filter F1 of FIG. 11.
Figure 16:
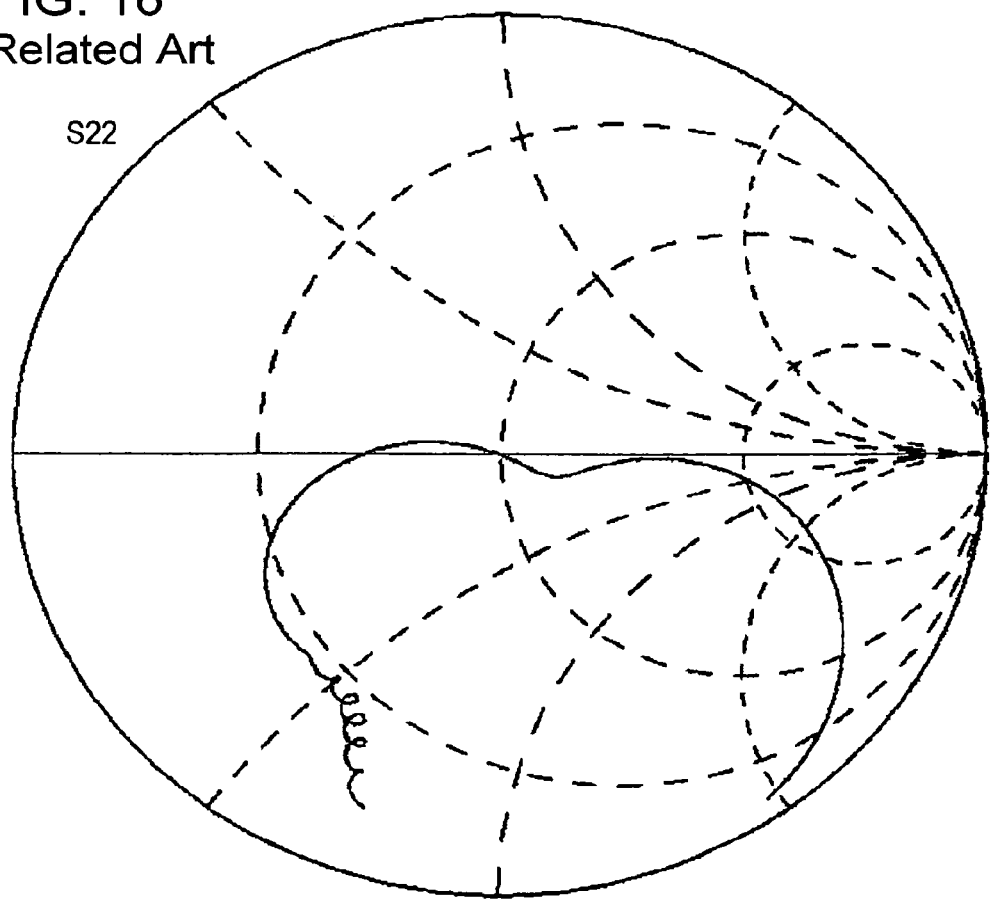
FIG. 16 is a circle diagram showing impedance characteristic of the dual mode SAW filter of FIG. 15.

Only the dual mode SAW filter F1 is taken out from the narrow-band cascaded dual mode SAW filter shown in FIG. 11, and the IDT electrodes 46a and 46b functioning as capacity elements are respectively connected in parallel to the output lead electrode, thereby constructing a filter as shown in FIG. 15. FIG. 16 is a circle diagram obtained by simulating the impedance characteristic of the filter shown in FIG. 15. As shown in FIG. 16, the impedance changes in the vicinity of the real axis within the passband, if the frequency is changed within the passband. The impedance changes at the position separated from the real axis, if the frequency is changed outside the passband.

In a filter of which the passband and attenuation band characteristic are excellent, the impedance shown within the passband substantially matches the terminal impedance. The impedance shown outside the passband does not match the terminal impedance. In other words, within the passband, the terminal impedance and the impedance of the filter match each other and the maximum power is supplied to the load, so that the loss of the filter is minimized. On the other hand, in a state where the terminal impedance and the impedance of the filter significantly mismatch outside the passband, the power supplied to the load is minimized, so that the loss of the filter increases. That is, the attenuation is shown.

When the dual mode SAW filters F1 and F2 shown in FIG. 1 are set to a SAW resonator, a capacity ratio assumed by the SAW resonator becomes larger (deteriorates) then the capacity ratio assumed by the dual mode SAW filters shown in FIGS. 9 and 11, and the frequency interval between the resonant frequency and the antiresonant frequency is narrowed. Therefore, without a capacity element being added, predetermined frequency allocation is constructed on the basis of a filter theory. Accordingly, it is considered that the passband characteristic of the filter becomes flat and the insertion loss decreases.

Figure 5:
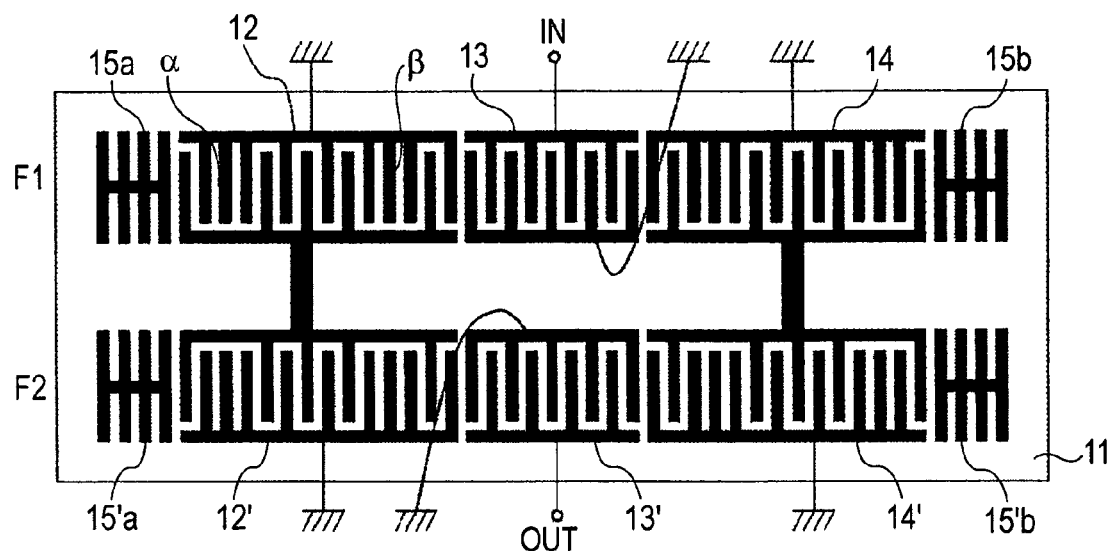
FIG. 5 is a schematic plan view illustrating the construction of a second embodiment according to the invention.

FIG. 5 is a plan view illustrating a second embodiment according to the invention. On the main surface of a piezoelectric substrate 11, IDT electrodes 12, 13, and 14 are disposed adjacent to each other along the propagation direction of a surface wave. On both sides of the IDT electrodes 12, 13, and 14, reflectors 15a and 15b are arranged, thereby forming a first dual mode SAW filter F1. Further, on the same piezoelectric substrate 11, a second dual mode SAW filter F2 including IDT electrode 12', 13', and 14' and reflectors 15'a and 15'b is formed in the same way as the first dual mode SAW filter F1. Then, the first and second dual mode SAW filters F1 and F2 are cascaded, thereby constructing a cascaded dual mode SAW filter.

Like a typical IDT electrode, the IDT electrode 13 (13') is formed of a pair of comb-shaped electrodes each having a plurality of electrode fingers which are fitted into each other. The feature of the second embodiment is present in the construction of the IDT electrodes 12 and 14 (12' and 14'). At least one electrode finger is thinned out from the pair of comb-shaped electrodes each having a plurality of electrode fingers which are fitted into each other, and electrode fingers connected to the comb-shaped electrode which is topologically reversed are then disposed, thereby constructing the IDT electrodes 12 and 14 (12' and 14'). Referring to the IDT electrode 12 of FIG. 5, two electrode fingers α and β are thinned out, and electrode fingers connected to the comb-shaped electrode which is topologically reversed are then disposed. The IDT electrodes 14, 12' and 14' are constructed in the same way as the IDT electrode 12. If the IDT electrodes are constructed in such a manner, a capacity ratio of the SAW resonator formed by the IDT 12, 13, and 14 (12', 13', and 14') becomes larger (deteriorates) than a capacity ratio of the construction according to the related art. When the cascaded dual mode SAW filter is constructed, capacity elements do not need to be added between stages.

Figure 6:
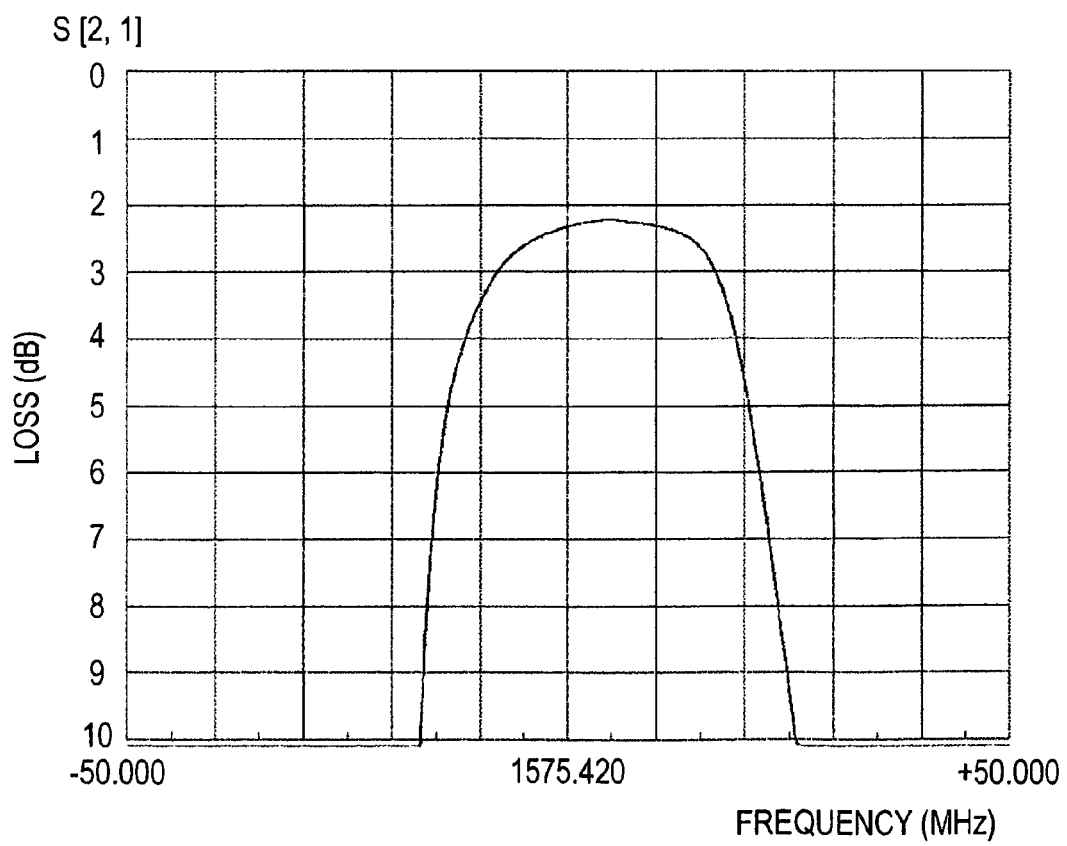
FIG. 6 shows passband characteristics obtained by simulation based on FIG. 5.

FIG. 6 shows filter characteristics obtained by simulation using the electrode pattern shown in FIG. 5, with the piezoelectric substrate set to a 38.7° Y—XLiTaO$_3$ substrate, the center frequency set to 1.5 GHz, 14.5 pairs of IDT electrodes 13 and 13', 9.5 pairs of respective IDT electrodes 12, 14, 12', and 14' (which are set before thinning out and in which two electrode fingers are thinned out and two electrode fingers connected to the comb-shaped electrode which is topologically reversed are disposed), the intersection width set to 35λ (λ is a wavelength), each number of reflectors 15a, 15b, 15'a, and 15'b set to 100, and the electrode film thickness set to 7.7%λ. As shown in FIG. 6, the flatness and insertion loss within the passband are comparable to those of FIG. 12.

Figure 7:
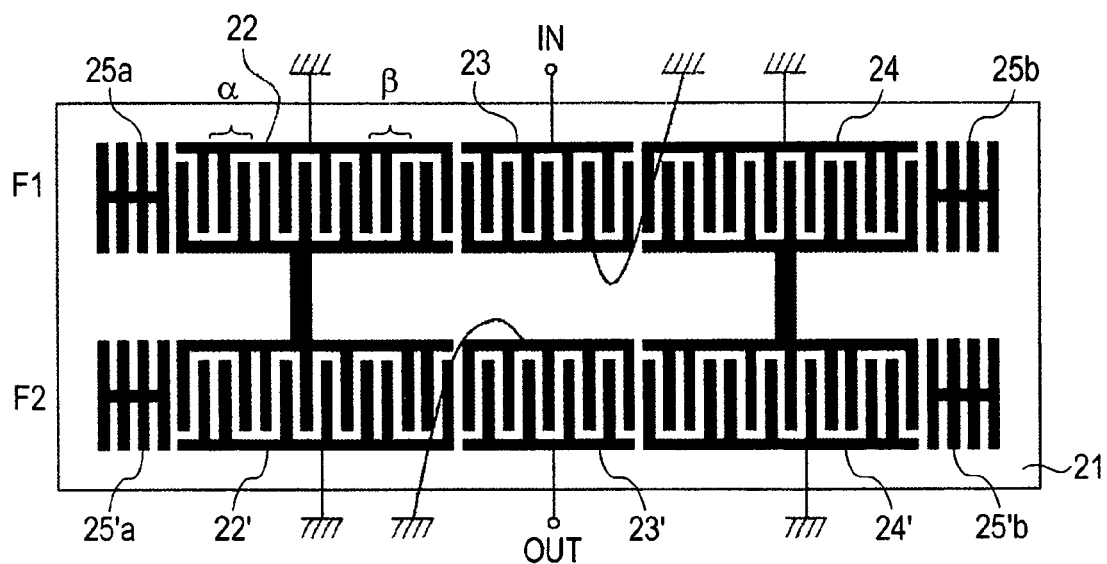
FIG. 7 is a schematic plan view illustrating the construction of a third embodiment according to the invention.

FIG. 7 is a plan view illustrating a third embodiment according to the invention. On the main surface of a piezoelectric substrate 21, the IDT electrodes 22, 23, and 24 are disposed adjacent to each other along the propagation direction of a surface wave. On both sides of the IDT electrodes 22, 23, and 24, reflectors 25a and 25b are arranged to form a first dual mode SAW filter F1. Further, on the same piezoelectric substrate 21, a second dual mode SAW filter F2 including IDT electrodes 22', 23', and 24' and reflectors 25'a and 25'b is formed in the same way as the first dual mode SAW filter F1. The first and second dual mode SAW filters F1 and F2 are cascaded, thereby constructing the cascaded dual mode SAW filter.

The feature of the third embodiment is the construction of the IDT electrodes 22 and 24 (22' and 24'). From a pair of comb-shaped electrodes each having a plurality of electrode fingers which are fitted into each other, at least one pair of electrode fingers are thinned out, and two electrode fingers connected to the comb-shaped electrode which is topologically reversed are then disposed, thereby constructing the IDT electrodes 22 and 24 (22' and 24'). Referring to the IDT electrode 22 of FIG. 7, two pairs of electrode fingers α and β are thinned out, and electrode fingers connected to the comb-shaped electrode which is topologically reversed are respectively disposed. The IDT electrodes 24, 22', and 24' are constructed in the same way as the IDT electrode 22. If the IDT electrodes are constructed in such a manner, a capacity ratio of a SAW resonator formed by the IDT 22, 23, and 24 (22', 23', and 24') becomes larger (deteriorates) than a capacity ratio of the construction according to the related art. When the cascaded dual mode SAW filter is constructed, a capacity element does not need to be added between stages.

Figure 8:
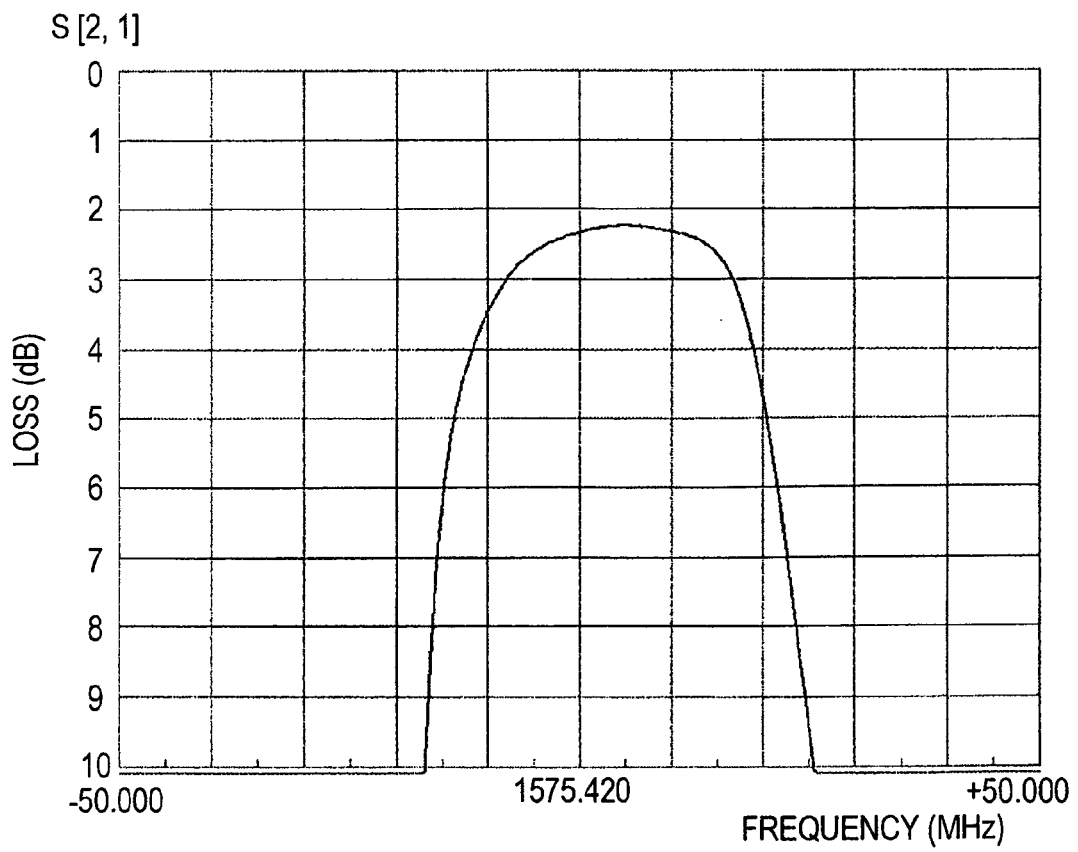
FIG. 8 shows passband characteristics obtained by simulation based on FIG. 7.

FIG. 8 shows filter characteristics obtained by simulation using the electrode pattern shown in FIG. 7, with the piezoelectric substrate set to a 38.7° Y—XLiTaO$_3$ substrate, the center frequency set to 1.5 GHz, 14.5 pairs of IDT electrodes 23 and 23', 9.5 pairs of respective IDT electrodes 22, 24, 22', and 24' (which are set before thinning out and in which two pairs of electrode fingers are thinned out and four electrode fingers connected to the comb-shaped electrode which is topologically reversed are disposed), the intersection width set to 35λ (λ is a wavelength), each number of reflectors 25a, 25b, 25'a, and 25'b set to 100, and the electrode film thickness set to 7.7%λ. As shown in FIG. 8, the flatness and insertion loss within the passband are comparable to those of FIG. 12.

Although the invention has been described by using lithium tantalate in which the cutting angle is 38.7°, the invention can be applied to lithium tantalate having a different cutting angle. Further, the invention can be applied to other piezoelectric materials such as lithium niobate and the like.

In addition, the cascaded dual mode SAW filter has been described. However, if the invention is applied to a one-stage dual mode SAW filter, the passband characteristic thereof becomes flat.

What is claimed is:

1. A surface acoustic wave filter (cascaded dual mode SAW filter) comprising:
   three IDT electrodes disposed adjacent to each other along the propagation direction of a surface wave on a piezoelectric substrate; and
   two primary-tertiary longitudinally-coupled dual mode SAW filters cascaded and constructed by arranging grating reflectors on both sides of three IDT electrodes,
   wherein the IDT electrodes disposed outside each have a floating electrode formed by thinning out at least a pair of electrode fingers therefrom, and another pair of electrode fingers alternately connected to a plus and minus electrode.

2. The surface acoustic wave filter according to claim 1, wherein two of the floating electrodes are disposed so as to be substituted for the pair of thinned-out electrode fingers, and are short-circuited with respect to each other.

* * * * *